US005394320A

United States Patent [19]
Blodgett

[11] Patent Number: 5,394,320
[45] Date of Patent: Feb. 28, 1995

[54] LOW VOLTAGE CHARGE PUMP CIRCUIT AND METHOD FOR PUMPING A NODE TO AN ELECTRICAL POTENTIAL

[75] Inventor: Greg A. Blodgett, Eagle, Id.

[73] Assignee: Micron Semiconductor, Inc., Boise, Id.

[21] Appl. No.: 137,565

[22] Filed: Oct. 15, 1993

[51] Int. Cl.$^6$ ............................................. H02M 7/25
[52] U.S. Cl. ........................................ 363/60; 363/59; 323/901
[58] Field of Search ............................ 363/60, 59, 49; 323/901

[56] References Cited

U.S. PATENT DOCUMENTS

| | | | |
|---|---|---|---|
| 4,839,787 | 6/1989 | Kojima et al. | 363/60 |
| 5,051,881 | 9/1991 | Herold | 363/60 |
| 5,245,524 | 9/1993 | Nakagawa et al. | 363/62 |
| 5,280,420 | 1/1994 | Rapp | 363/60 |

Primary Examiner—Steven L. Stephan
Assistant Examiner—Robert Nappi
Attorney, Agent, or Firm—Susan B. Collier

[57] ABSTRACT

A charge pump circuit and method for increasing a value of a supply potential. The charge pump circuit features a first stage circuit for generating an intermediate pumped potential greater than an input supply potential. The intermediate pumped potential becomes a supply potential for a portion of a second stage circuit. The second stage circuit generates a pumped output potential greater than the intermediate pumped potential. Both the first and second stage circuits have at least two capacitors, a small pump capacitor and a large pump capacitor. The first stage circuit of the invention supplies the increased intermediate pumped potential to those nodes which are used to charge the small pump capacitor of the second stage circuit. The input supply potential supplies the potential to those nodes which are used to charge the large pump capacitors of both stages and the small pump capacitor of the first stage circuit. The small pump capacitor of the second stage circuit, in turn, supplies the gate voltage to an n-channel transistor of the second stage circuit which passes a full charge from the large pump capacitor to the output. Charging only the small pump capacitor of the second stage circuit with the intermediate pumped potential minimizes the loading effect of the second stage circuit on the first stage circuit.

18 Claims, 3 Drawing Sheets

LOW VOLTAGE CHARGE PUMP CIRCUIT AND METHOD FOR PUMPING A NODE TO AN ELECTRICAL POTENTIAL

FIELD OF THE INVENTION

The invention relates to semiconductor circuit devices, and more particularly to charge pump circuits for providing a voltage to various components on semiconductor integrated circuits. The invention is particularly applicable to dynamic random access memory devices (DRAMs).

BACKGROUND OF THE INVENTION

U.S. Pat. No. 5,038,325, entitled "High Efficiency Charge Pump Circuit" describes one charge pump and is herein incorporated by reference.

In order to pass a full charge to a DRAM memory cell through an n-channel access transistor, it is necessary to drive the gate of the n-channel access transistor to a voltage greater than the voltage used to charge the storage capacitor. Modern dynamic random access memories (DRAMs) use charge pumps to generate this higher potential.

A typical external supply potential is referred to as $V_{ccx}$. $V_{ccx}$ is often regulated. The internally regulated potential is referred to as $V_{cc}$. In many applications $V_{ccx}$ is equal to 5 volts and $V_{cc}$ is regulated to 3.3 volts. A potential generated in a charge pump is generally referred to as $V_{ccp}$. In typical cases $V_{ccp}$ is two volts greater than the DRAM's internal regulated voltage, or two volts above $V_{ccx}$ for DRAM's that do not use a regulated $V_{cc}$.

Previous charge pump circuits have had difficulty operating with a $V_{cc}$ below three volts. There have been attempts to design circuits to overcome this problem.

In one attempt to increase the efficiency of a charge pump having a regulated supply potential, a level translator circuit was added between the logic of the pump, and the pump capacitors. The level translator allowed the circuit to draw current from the external power source $V_{ccx}$ rather than the regulated source $V_{cc}$. With this circuit a potential of $(2V_{ccx} - V_t)$ could be passed through a pump n-channel transistor as $V_{ccp}$, where $V_t$ is the threshold voltage of the pump n-channel transistor. Thus for a $V_{ccx}$ of 4 volts, the $V_{ccp}$ is equal to 7 volts for a $V_t$ of 1 volt. This is sufficient for transferring a full $V_{cc}$ into a memory location of a DRAM. In early regulated devices, $V_{cc}$ may range from 3.5 to 4 volts. However, there is currently a trend toward lower levels of $V_{ccx}$. Current specifications require $V_{ccx}$ of 2.7 to 3.6 volts, and the trend is toward even lower $V_{ccx}$ levels. In systems with low $V_{ccx}$, there is no longer a need for a regulated $V_{cc}$. Instead, $V_{ccx}$ is used throughout the circuit. $V_{ccp}$ is still required to pass a full $V_{ccx}$ in to the DRAM memory cell. As $V_{ccx}$ is reduced, the efficiency of the $V_{ccp}$ pump is also reduced since the charge available for transfer to $V_{ccp}$ is proportional to $V_{ccx}$ times the capacitance of the pump capacitor. Thus as $V_{ccx}$ is reduced, the pump eventually fails.

In another attempt $2V_{ccx}$ can be passed through as $V_{ccp}$ in a two stage pump by using one pump to generate the entire supply voltage for a second pump. This approach is inefficient for a low level supply potential and is impractical since all the charge eventually is generated from the first pump. In this configuration a very large first stage pump is required to provide the required supply potential for the second stage pump.

Thus a need exists to provide a pumped potential at the gate of the access transistor such that the full charge on the memory storage capacitor is passed through the access transistor for devices with low $V_{ccx}$.

SUMMARY OF THE INVENTION

The invention is a charge pump circuit for generating a pumped potential. In one application the pumped potential is used to pass a full charge to or from a storage capacitor of a dynamic random access memory (DRAM). The charge pump circuit of the invention features a first stage circuit and a second stage circuit, and there is minimal loading of the first stage circuit by the second stage circuit. The pumped potential passed from the second stage circuit to a charge pump output node comes primarily from $V_{ccx}$ and not from the first stage pump. This allows the first stage to remain small.

The first stage circuit of the invention generates an intermediate pumped potential greater than an input supply potential. The intermediate pumped potential becomes a supply potential for a portion of the second stage circuit. The second stage circuit generates a pumped output potential greater than the intermediate pumped potential.

Both the first and second stage circuits have at least two capacitors, a small pump capacitor and a large pump capacitor. The first stage circuit of the invention supplies the increased intermediate pumped potential to those nodes which are used to charge the small pump capacitor of the second stage circuit. The input supply potential supplies the potential to those nodes which are used to charge the large pump capacitors of both stages and the small pump capacitor of the first stage circuit. The small pump capacitor of the second stage circuit, in turn, supplies the gate voltage to an n-channel transistor of the second stage circuit which passes a full charge from the large pump capacitor of the second stage circuit to the output. Charging only the small pump capacitor of the second stage circuit with the intermediate pumped potential minimizes the loading effect of the second stage circuit on the first stage circuit.

The first stage circuit is used to boost the efficiency of the second stage circuit. The loading on the first stage circuit is very small in comparison to the load which will be driven by the pumped output potential. Since the second stage circuit is operating off of the intermediate pumped potential generated from the first stage circuit, it is more efficient and is able to source the $V_{ccp}$ at a lower $V_{cc}$ or $V_{ccx}$ level than if the first and the second stage circuits were running in parallel.

DETAILED DESCRIPTION OF THE INVENTION

The invention is a charge pump circuit and method for generating a pumped potential. In one application the pumped potential is used to pass a full charge to or from a storage capacitor of a dynamic random access memory (DRAM). The charge pump circuit of the invention features a first stage circuit having pump capacitors and a second stage circuit having pump capacitors. Both the first and the second stage circuits are connected to either an external supply potential or a regulated supply potential. The first stage circuit increases the supply potential to create an intermediate pumped potential which functions as an additional supply potential to the second stage circuit. There is minimal loading on the first stage associated with the charging of the second stage pump capacitors.

Figure 1:
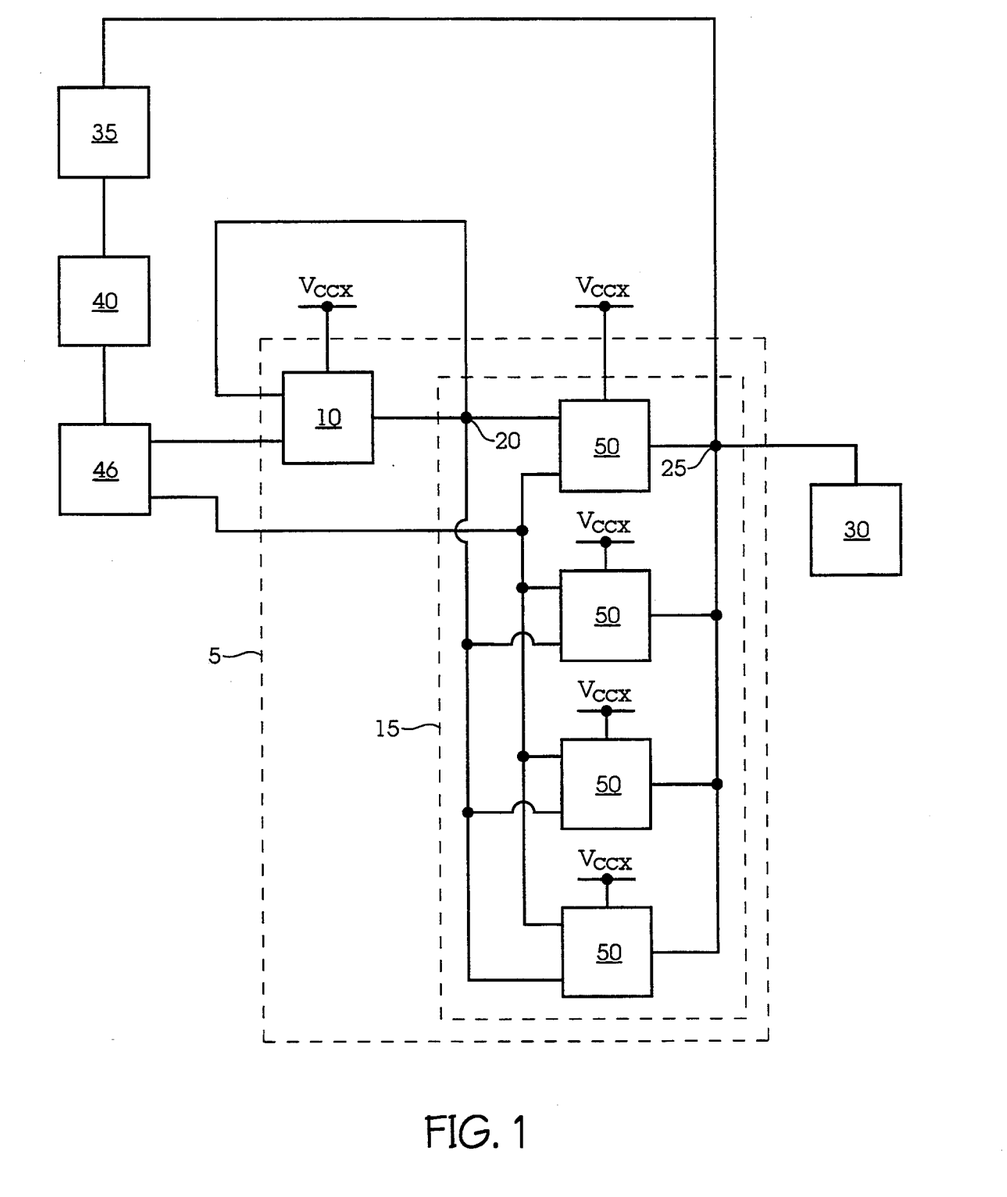
FIG. 1 is a block schematic of a circuit of the invention.

FIG. 1 is a block schematic of the charge pump circuit 5 of the invention. The charge pump circuit 5 comprises a first stage circuit 10 and a second stage circuit 15. The first stage circuit 10, which is connected to and driven by an external supply potential, $V_{ccx}$, or alternately to a regulated $V_{ccx}$, $V_{cc}$, generates the intermediate pumped potential at intermediate output node 20. The second stage circuit 15 is also connected to and driven by $V_{ccx}$, and the intermediate pumped potential is the additional supply potential to the second stage circuit 15. The second stage circuit 15 generates the pumped output potential ($V_{ccp}$) of the charge pump circuit 5 at node 25. The $V_{ccp}$ at node 25 may be used to pass charge to and from storage capacitors of a DRAM or may drive some other load 30. $V_{ccp}$ is also fed back to a voltage regulator circuit 35 which monitors the value of $V_{ccp}$. When $V_{ccp}$ falls below a desired level the voltage regulator circuit 35 actuates an oscillator circuit 40 which supplies an input signal having a period to a logic circuit 46. The logic circuit, in response to the oscillator signal, generates logic control signals to control the generation of $V_{ccp}$ by the charge pump circuit 5. The intermediate pumped potential is greater than the supply potential of the charge pump circuit 5, and $V_{ccp}$ is greater than the intermediate pumped potential. Regulators and oscillators are well known to those skilled in the art and may be implemented with various circuit configurations.

The second stage circuit 15 of FIG. 1 comprises four subcircuits 50 configured in parallel with each other. Each subcircuit is connected to $V_{ccx}$. Each subcircuit is also connected to the intermediate node 20 and the intermediate pumped potential becomes a supply potential for a portion of each subcircuit 50. Each subcircuit 50 responds to at least one logic control signal. The actual number of subcircuits may vary and may be greater or less than four.

Figure 2:
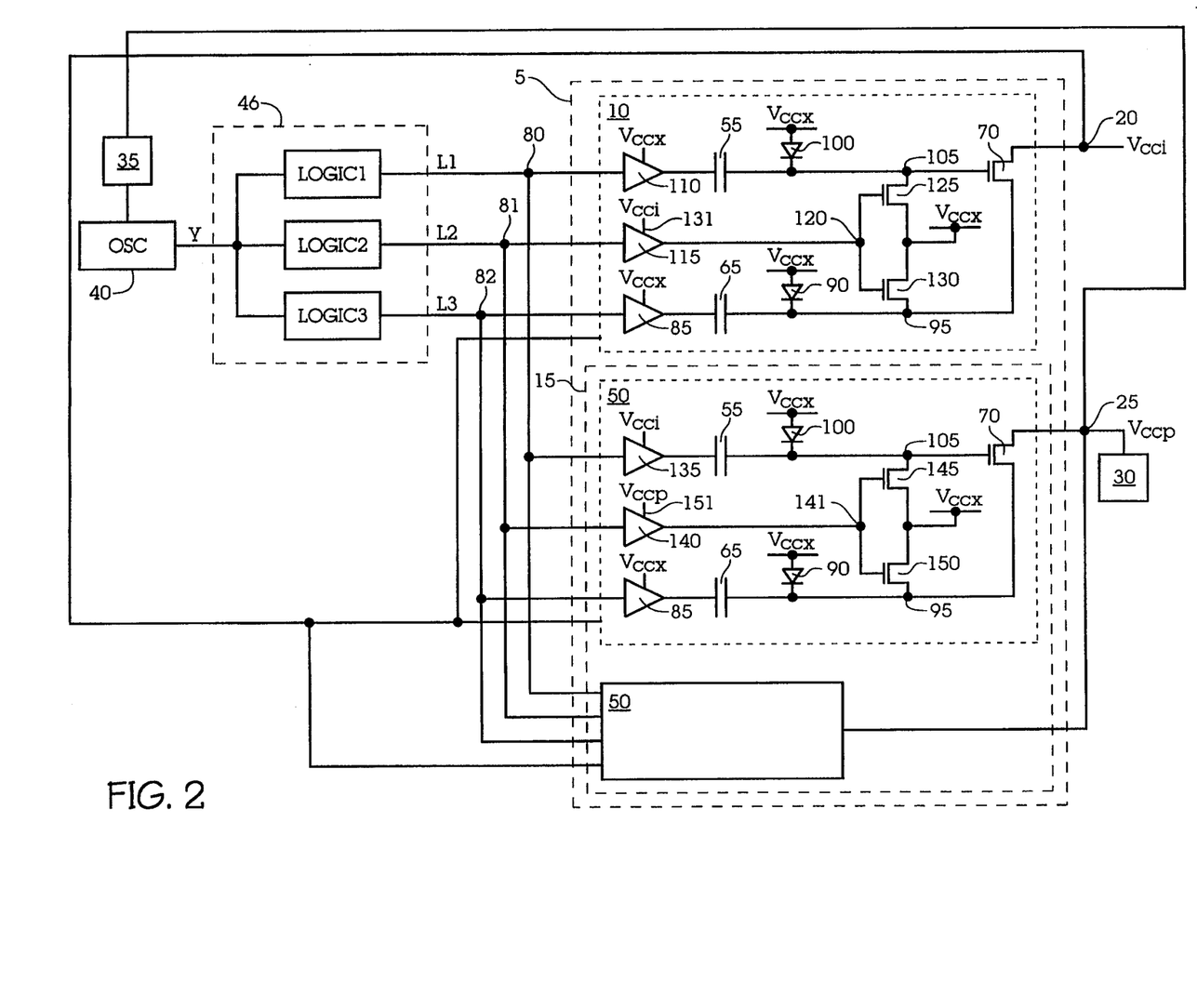
FIG. 2 is a more detailed schematic of the circuit of FIG. 1.

FIG. 2 is a more detailed schematic of the circuit of FIG. 1. Identical elements of FIGS. 1 and 2 have been numbered the same. Only one of the subcircuits 50 is detailed schematically in FIG. 2. The remaining three subcircuits have identical circuitry. Therefore, the description of the detailed subcircuit 50 is valid for the remaining subcircuits, and references to subcircuit 50 in the following description apply to each of the subcircuits 50. Some components in subcircuit 50 will be designated as either a "second stage" or a "first stage" component in order to distinguish similar components of the two circuit stages.

Both the first stage circuit 10 and the subcircuit 50 of the second stage circuit 15 have a small capacitor 55 and a large capacitor 65. A first stage transistor 70 passes the charge stored on the first stage large capacitor 65 to intermediate node 20 when first stage transistor 70 is gated by the charge stored on the first stage small capacitor 55, and second stage transistor 70 passes the charge stored on the second stage large capacitor 65 to output node 25 when second stage transistor 70 is gated by the charge stored on the second stage small capacitor 55. First and second stage transistors 70 are connected at their respective input terminal to first and second stage large capacitors 65 respectively.

Although in this embodiment the capacitance of the small capacitor 55 is smaller than the capacitance of the large capacitor 65 the invention is equally applicable when the capacitors have equal capacitances.

The logic circuit 46 responds to the oscillator signal and produces first (L1), second (L2), and third (L3) logic control signals at output nodes 80, 81, and 82 respectively. L1, L2, and L3 are control input signals to both the first 10 and second 15 stage circuits. Each section of the logic circuit 46 can be designed by someone skilled in the art to create the desired logic signals L1, L2, and L3 as described herein, and the exact circuitry is not detailed in this specification.

Figure 3:
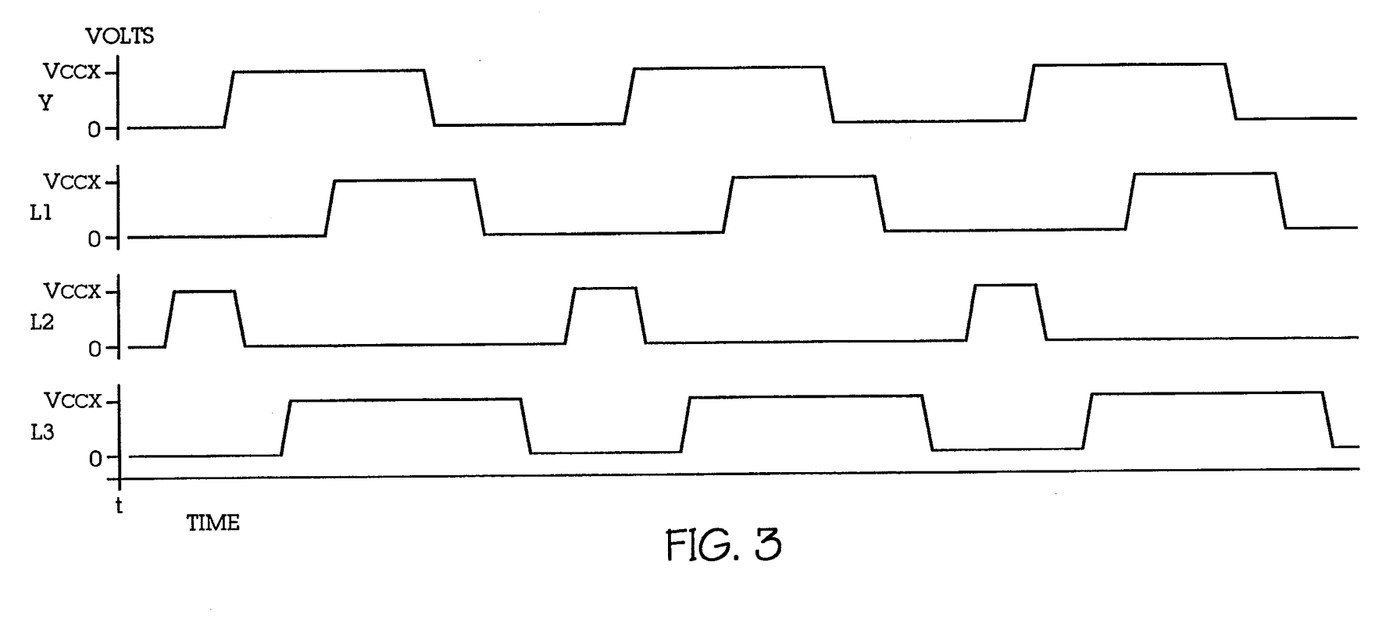
FIG. 3 is a timing diagram of an oscillator signal used to drive logic circuitry of the invention.

In one embodiment L1, L2, and L3 are periodic signals having equal periods which are equal to the period of the oscillator, however the three signals have different duty cycles, as can be seen by examining the timing diagram shown in FIG. 3. The oscillator signal is represented by Y and the logic signals are represented by L1, L2, and L3 in FIG. 3. The vertical axis represents electrical potential and the horizontal axis represents time. Signal L1 transitions low prior to L3 transitioning low and transitions high after L3 transitions high. In this embodiment signal L3 is high longer than it is low, and signal L2 transitions high after both L1 and L3 transition low and returns to the low state while both L1 and L3 are still low.

Referring again to FIG. 2, it can be seen that each of the large capacitors 65 is connected to a buffer 85 which is supplied by $V_{ccx}$. Buffer 85 may alternately be a level translator in the event that the device has a regulated $V_{cc}$ which is used to generate L1, L2, and L3. In this event 85 would translate the signal L3 from $V_{cc}$ to $V_{ccx}$. This is true in both the first stage circuit 10 and subcircuits 50.

A diode 90 is electrically interposed between each large capacitor 65 and $V_{ccx}$ and is connected to large capacitor 65 at node 95. The diode 90 holds the potential of node 95 at $V_{ccx} - V_{t1}$, where $V_{t1}$ is the threshold voltage of diode 90. A threshold voltage of a device is the minimum potential that must be applied to the device in order for the device to conduct current. When the logic circuit generates a high active signal at node 82, buffers 85 drive a high signal to their respective nodes 95 thereby increasing the potential of nodes 95 by $V_{ccx}$ and bringing the potential of nodes 95 to $2V_{ccx} - V_{t1}$.

A diode 100 is electrically interposed between each small capacitor 55 and $V_{ccx}$ and is connected to small capacitor 55 at node 105. The diode 100 holds the potential of node 105 at $V_{ccx} - V_{t2}$, where $V_{t2}$ is the threshold voltage of diode 100. When the logic circuit generates a high active signal at node 80 level buffer 110 drives a high signal to first stage node 105 thereby increasing the potential of first stage node 105 by $V_{ccx}$ and bringing the potential of first stage node 105 to $2V_{ccx} - V_{t2}$. The $2V_{ccx} - V_{t2}$ on node 105 actuates first stage transistor 70. The charge on first stage node 95 is passed through the actuated first stage transistor 70 with a $V_{t3}$ (the threshold voltage of first stage transistor 70) loss to the intermediate node 20, driving the intermediate node to a potential equal to two times $V_{ccx}$ minus $V_{t2}$ and minus $V_{t3}$. In the case where the two threshold voltages are equal the formula for $V_{cci}$ is $2V_{ccx}-2V_{t3}$.

The potential of the intermediate node 20 is called the intermediate pumped potential, $V_{cci}$.

A first stage precharge circuit comprises a level translator circuit 115, a common node 120, and transistors 125 and 130 electrically interposed between $V_{ccx}$ and nodes 105 and 95 respectively. Level translator circuit 115 is connected at a level translator circuit supply node 131 to the intermediate node 20. The level translator circuit 115 is interposed between output node 81 and common node 120. Common node 120 is connected to the gates of the transistors 125 and 130. When the logic signal L2 at node 81 goes high it is level translated from $V_{cc}$ or $V_{ccx}$ to the intermediate potential which in turn actuates transistors 125 and 130 thereby precharging first stage nodes 105 and 95 to a full $V_{ccx}$ level.

Since the first stage nodes 105 and 95 are precharged to the full $V_{ccx}$ level they are allowed to swing from $V_{ccx}$ to $2V_{ccx}$, rather than $2V_{ccx}-V_{t2}$, as L1 and L3 swing from 0 V to $V_{cc}$. Therefore the potential at the intermediate node is now allowed to swing up to $2V_{ccx}-V_{t3}$, where $V_{t3}$ is the threshold voltage of first stage transistor 70. Once the potential of the intermediate node reaches this value, $2V_{ccx}-V_{t3}$, it is referred to as the intermediate pumped potential, $V_{cci}$.

Subcircuit 50 comprises a second stage precharge circuit similar to the first stage precharge circuit. The second stage precharge circuit comprises a level translator circuit 140, a common node 141, and transistors 145 and 150. Level translator circuit 140 is connected at a level translator circuit supply node 151 to output node 25. Since the potential of the output node is the pumped potential and is greater than the intermediate pumped potential, when the logic signal L2 at node 81 goes high it is level translated from $V_{ccx}$ to $V_{ccp}$ which in turn actuates transistors 145 and 150. Therefore second stage nodes 105 and 95 are precharged to $V_{ccx}$ when L2 is high.

The $V_{cci}$ generated by the first stage circuit 10 and equal to $2V_{ccx}-V_{t3}$ becomes the supply potential for a second stage level translator circuit 135. When the logic circuit generates the high active signal at node 80, level translating circuit 135 translates the high $V_{cci}$ to second stage node 105 which has been precharged to $V_{ccx}$. Therefore the potential of second stage node 105 is equal to $3V_{ccx}-V_{t3}$. The $3V_{ccx}-V_{t3}$ actuates second stage transistor 70 passing the full value, $2V_{ccx}$, of the potential at second stage node 95 to output node 25. The pumped potential, $V_{ccp}$, at output node 25 is therefore equal to $2V_{ccx}$ as long as $3V_{ccx}-V_{t3}-V_{t4}$, where $V_{t4}$ is the threshold voltage of the second stage transistor 70, is greater than or equal to $2V_{ccx}$. For example if all of the $V_t$s of the circuit were equal to 1 volt the circuit would not function optimally below 2 volts.

Therefore even though $V_{ccx}$ may be decreased due to design considerations the pumped output potential is not decreased by the threshold voltage, and the pumped output potential at node 25 is large enough to allow the full charge of a storage capacitor to be passed to and from the storage capacitors of a DRAM. This is true even for small supply potentials less than 3 volts.

The generation of the pumped potential of the invention is efficient since the majority of current draw of the second stage circuit is supplied by $V_{ccx}$. Thus the first stage can have a small driving capacity since it is not loaded by the second stage.

An example may help the reader appreciate the advantages of the invention. Assume $V_{ccx}$ is equal to 2 volts and all $V_t$s are equal to 1 volt. When the logic circuit 46 responds to the oscillator signal the small 55 and large 65 pump capacitors of the first stage circuit 10 charge to twice $V_{ccx}$ or 4 volts. The 4 volt potential on the first stage small pump capacitor 55 actuates first stage transistor 70. Then the 4 volt potential stored on the first stage large pump capacitor 65 is coupled to the intermediate node 20 with a 1 volt loss due to the threshold potential of the first stage transistor 70, and the intermediate pumped potential is equal to 3 volts.

Now the intermediate pumped potential is level translated to second stage node 105 which is precharged to 2 volts. Therefore the potential of second stage node 105 is equal to 5 volts. Second stage node 95 is charged to twice $V_{ccx}$ or 4 volts. The 5 volts on second stage node 105 actuates second stage transistor 70 which then passes the 4 volts on second stage node 95 to output node 20 without a loss. Thus the pumped potential at node 25 is equal to 4 volts which is sufficient to actuate an access transistor and allow a full value of a potential stored or to be stored on a storage capacitor to pass through the access transistor.

Although the invention refers to a method for pumping a supply potential to a value capable of actuating an access transistor such that the access transistor passes a full charge to and from storage capacitors of a DRAM, it is not restricted to implementations which involve memory devices or semiconductor devices.

Where electrical functions and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is therefore intended to include components which are in electrical communication despite intervening components.

The circuit and method of the invention have utility in other circuits where a pumped potential is desired and is not limited to DRAM circuits. Accordingly the invention should be read as limited only by the claims.

What is claimed is:

1. A voltage pump for increasing a value of an input supply potential, comprising:
  a) an input supply node connectable to the input supply potential;
  b) a first stage circuit in electrical communication with the input supply node, said first stage circuit generating an intermediate pumped potential greater than the input supply potential, wherein said first stage circuit comprises:
    i) a first switching device having a control input and a first and a second terminal, said first switching device having a threshold voltage;
    ii) a first buffer circuit in electrical communication with said input supply node;
    iii) a first capacitor electrically interposed between said first buffer circuit and said control input, said first capacitor passing said input supply potential from said first buffer circuit to said control input thereby increasing a value of a potential at said control input, said potential of said control input reaching a first actuation potential having a value capable of actuating said first switching device, wherein said first actuation potential is at least equal to said intermediate potential plus said threshold voltage;

iv) a second buffer circuit in electrical communication with said input supply node;

v) a second capacitor electrically interposed between said second buffer circuit and said second terminal, said second capacitor passing said input supply potential from said second buffer circuit to said second terminal thereby increasing a value of a potential on said second terminal, said potential on said second terminal passed to said first terminal with a loss equal to said threshold voltage when said first switching device is actuated by said first actuation potential, said potential on said first terminal being said intermediate potential; and c) a second stage circuit in electrical communication with the input supply node, said second stage circuit generating an output potential greater than said intermediate pumped potential, said first and said second stage circuits in electrical communication with each other, wherein said second stage circuit comprises:

i) a second switching device having a control input and a first and a second terminal, said second switching device having a threshold voltage;

ii) a third buffer circuit in electrical communication with said first terminal of said first switching device and in electrical communication with said control input of said second switching device;

iii) a third capacitor electrically interposed between said third buffer circuit and said control input of said second switching device, said third capacitor passing said intermediate potential from said third buffer circuit to said control input of said second switching device thereby increasing a value of a potential at said control input, said potential of said control input of said second switching device reaching a second actuation potential having a value capable of actuating said second switching device, wherein said second actuation potential is at least equal to said output potential plus said threshold voltage of said second switching device;

iv) a fourth buffer circuit in electrical communication with said input supply node; and v) a fourth capacitor electrically interposed between said fourth buffer circuit and said second terminal of said second switching device, said fourth capacitor passing said input supply potential from said fourth buffer circuit to said second terminal of said second switching device thereby increasing a value of a potential on said second terminal of said second switching device, said potential on said second terminal of said second switching device passed to said first terminal of said second switching device without loss through said second switching device when said second switching device is actuated by said second actuation potential, said potential on said first terminal of said second switching device being said output potential.

2. A circuit for increasing a value of a supply potential, comprising:

a) a first transistor, having a control input, a potential of said control input called a first control potential, said first transistor interposed between an intermediate node and a first node, said first transistor characterized by a threshold voltage;

b) a supply node for accepting the supply potential;

c) a first capacitor in electrical communication with said supply node and in electrical communication with said first node, said first capacitor passing said supply potential to said first node thereby increasing a value of a potential on said first node by a value equal to the value of the supply potential;

d) a second capacitor in electrical communication with said supply node and in electrical communication with said control input, said second capacitor passing said supply potential to said control input thereby increasing a value of said first control potential such that the potential of said first node experiences only a loss equal to the threshold voltage when passed through said first transistor to said intermediate node when said first transistor is actuated by said first control potential;

e) a second transistor, having a control input, a potential of said control input of said second transistor called a second control potential, said second transistor interposed between an output node and a second node, said second transistor characterized by a threshold voltage;

f) a third capacitor in electrical communication with said supply node and in electrical communication with said second node, said third capacitor passing said supply potential to said second node thereby increasing a potential on said second node by a value equal to at least said value of the supply potential; and g) a fourth capacitor in electrical communication with said intermediate node and in electrical communication with said control input of said second transistor, said fourth capacitor passing said intermediate potential to said control input of said second transistor thereby increasing a value of said second control potential such that the potential of said second node is passed through said second transistor to said output node without a potential loss when said second transistor is actuated by said second control potential.

3. A circuit for increasing a value of a supply potential, comprising:

a) a first transistor, having a control input, a potential of said control input called a first control potential, said first transistor interposed between an intermediate node and a first node, said first transistor characterized by a threshold voltage;

b) a supply node for accepting the supply potential;

c) a first capacitor in electrical communication with said supply node and in electrical communication with said first node, said first capacitor passing said supply potential to said first node thereby increasing a value of a potential on said first node by a value equal to the value of the supply potential;

d) a second capacitor in electrical communication with said supply node and in electrical communication with said control input, said second capacitor passing said supply potential to said control input thereby increasing a value of said first control potential such that the potential of said first node experiences only a loss equal to the threshold voltage when passed through said first transistor to said intermediate node when said first transistor is actuated by said first control potential;

e) a second transistor, having a control input, a potential of said control input of said second transistor called a second control potential, said second transistor interposed between an output node and a second node, said second transistor characterized by a threshold voltage;

f) a third capacitor in electrical communication with said supply node and in electrical communication with said second node, said third capacitor passing said supply potential to said second node thereby increasing a potential on said second node by a value equal to at least said value of the supply potential;

g) a fourth capacitor in electrical communication with said intermediate node and in electrical communication with said control input of said second transistor, said fourth capacitor passing said intermediate potential to said control input of said second transistor thereby increasing a value of said second control potential such that the potential of said second node is passed through said second transistor to said output node without a potential loss when said second transistor is actuated by said second control potential;

h) a first precharge means for charging said control input of said first transistor to the supply potential and for charging said first node to the supply potential, such that said value of said first control potential increases to equal twice the supply potential and such that said value of said potential at said first node increases to equal twice the supply potential, thereby generating an intermediate potential at said intermediate node equal to twice the supply potential minus the threshold voltage of said first transistor; and i) a second precharge means for charging said control input of said second transistor to the supply potential and for charging said second node to the supply potential, such that said value of said second control potential increases to equal the intermediate potential plus the supply potential and such that the value of said potential at said second node increases to equal twice the supply potential, thereby generating an output potential at said output node equal to twice the supply potential when said value of said second control potential is at least equal to twice the supply potential plus the threshold voltage of said second transistor.

4. A circuit for increasing a value of a supply potential, comprising:

a) a first transistor, having a control input, a potential of said control input called a first control potential, said first transistor interposed between an intermediate node and a first node, said first transistor characterized by a threshold voltage;

b) a supply node for accepting the supply potential;

c) a first capacitor in electrical communication with said supply node and in electrical communication with said first node, said first capacitor passing said supply potential to said first node thereby increasing a value of a potential on said first node by a value equal to the value of the supply potential;

d) a second capacitor in electrical communication with said supply node and in electrical communication with said control input, said second capacitor passing said supply potential to said control input thereby increasing a value of said first control potential such that the potential of said first node experiences only a loss equal to the threshold voltage when passed through said first transistor to said intermediate node when said first transistor is actuated by said first control potential;

e) a second transistor, having a control input, a potential of said control input of said second transistor called a second control potential, said second transistor interposed between an output node and a second node, said second transistor characterized by a threshold voltage;

f) a third capacitor in electrical communication with said supply node and in electrical communication with said second node, said third capacitor passing said supply potential to said second node thereby increasing a potential on said second node by a value equal to at least said value of the supply potential;

g) a fourth capacitor in electrical communication with said intermediate node and in electrical communication with said control input of said second transistor, said fourth capacitor passing said intermediate potential to said control input of said second transistor thereby increasing a value of said second control potential such that the potential of said second node is passed through said second transistor to said output node without a potential loss when said second transistor is actuated by said second control potential;

h) a first buffer circuit in electrical communication with said supply node and in electrical communication with said first capacitor, said first buffer circuit presenting the supply potential to the first capacitor;

i) a second buffer circuit in electrical communication with said supply node and in electrical communication with said second capacitor, said second buffer circuit presenting the supply potential to said second capacitor;

j) a third buffer circuit in electrical communication with said supply node and in electrical communication with said third capacitor, said third buffer circuit presenting said supply potential to said third capacitor; and k) a fourth buffer circuit in electrical communication with said intermediate node and in electrical communication with said fourth capacitor, said fourth buffer circuit presenting said intermediate potential to said fourth capacitor.

5. A circuit for increasing a value of a supply potential, comprising:

a first transistor, having a control input, a potential of said control input called a first control potential, said first transistor interposed between an intermediate node and a first node, said first transistor characterized by a threshold voltage;

b) a supply node for accepting the supply potential;

c) a first capacitor in electrical communication with said supply node and in electrical communication with said first node, said first capacitor passing said supply potential to said first node thereby increasing a value of a potential on said first node by a value equal to the value of the supply potential;

d) a second capacitor in electrical communication with said supply node and in electrical communication with said control input, said second capacitor passing said supply potential to said control input thereby increasing a value of said first control potential such that the potential of said first node experiences only a loss equal to the threshold voltage when passed through said first transistor to said intermediate node when said first transistor is actuated by said first control potential;

e) a second transistor; having a control input, a potential of said control input of said second transistor called a second control potential, said second transistor interposed between an output node and a second node, said second transistor characterized by a threshold voltage;

f) a third capacitor in electrical communication with said node and in electrical communication with said second node, said third capacitor passing said supply potential to said second node thereby increasing a potential on said second node by a value equal to at least said value of the supply potential;

g) a fourth capacitor in electrical communication with said intermediate node and in electrical communication with said control input of said second transistor, said fourth capacitor passing said intermediate potential to said control input of said second transistor thereby increasing a value of said second control potential such that the potential of said second node is passed through said second transistor to said output node without a potential loss when said second transistor is actuated by said second control potential;

h) a first passive device for pulling the potential of said first node toward said supply potential;

i) a second passive device for pulling the potential of said second node toward said supply potential;

j) a third passive device for pulling the potential of said control input of said first transistor toward said supply potential; and k) a fourth passive device for pulling the potential of said control input of said second transistor toward said supply potential.

6. A method for increasing a value of a supply potential, comprising the following steps:

a) increasing a first control potential of a first control node by a value of the supply potential;

b) actuating a first switching device with said first control potential of said first control node;

c) increasing a potential of a first terminal of said first switching device to a value greater than said supply potential;

d) driving said potential of said first terminal to a second terminal of said first switching device with a loss equal to a threshold voltage of said first switching device, said potential on said second terminal being an intermediate potential which is greater than the supply potential;

e) increasing a second control potential of a second control node by a value of said intermediate potential;

f) actuating a second switching device with said second control potential; and g) driving an output potential greater than said intermediate potential to an output node through said switching device, said second control potential equal to or greater than said output potential plus a threshold voltage of said switching device.

7. A method for pumping an input potential to a value capable of driving an electrical circuit, comprising the following steps:

a) increasing a value of the input potential to provide a first actuation potential;

b) increasing a value of the input potential to provide a first boosted potential;

c) actuating a first coupling device with said first actuation potential;

d) driving said first boosted potential through said first coupling device with a potential loss to a first output node, said potential on said first output node being a first output potential;

e) passing said first output potential to a control terminal of a second coupling device thereby increasing a value of a control potential on a control node of said second coupling device to a second actuation potential;

f) increasing a value of said input potential to provide a second boosted potential;

g) actuating said second coupling device with said second actuation potential; and h) driving a full value of said second boosted potential through said second coupling device to a second output node, said second boosted potential capable of driving the electrical circuit.

8. A voltage pump for increasing a value of an input supply potential, comprising:

a) an input supply node connectable to the input supply potential;

b) a first stage output node;

c) a first circuit portion in electrical communication with the input supply node, said first circuit portion generating a first boosted potential;

d) a first stage switching device having a gate, a gate potential at said gate determining an actuation and deactuation of said first stage switching device, said first stage switching device electrically interposed between said first stage output node and said first circuit portion, said first stage switching device electrically isolating said first stage output node from said first circuit portion when deactuated and electrically coupling said first circuit portion to said first stage output node when actuated;

e) a second circuit portion in electrical communication with the input supply node, said second circuit portion generating a first stage actuation potential, greater than the input supply potential, at said gate of said first stage switching device such that said first stage switching device couples, when actuated by the first stage actuation potential, the first boosted potential with a potential loss equal to a threshold voltage of said first stage switching device to the first stage output node, the potential on the first stage output node being called an intermediate potential, wherein said intermediate potential is greater than the input supply potential;

f) a second stage output node;

g) a third circuit portion in electrical communication with the input supply node, said third circuit portion generating a second boosted potential greater than the intermediate potential;

h) a second stage switching device having a gate, a gate potential at said gate of said second stage switching device determining an actuation and deactuation of said second stage switching device, said second stage switching device electrically interposed between said second stage output node and said third circuit portion, said second stage switching device electrically isolating said second stage output node from said third circuit portion when deactuated and electrically coupling said third circuit portion to said second stage output node when actuated; and i) a fourth circuit portion in electrical communication with the first stage output node, said fourth circuit portion generating a second stage actuation potential, greater than the intermediate potential, at said gate of said second stage switching device such that said second stage switching device couples, when actuated by the second stage actuation potential, said second boosted potential to the second stage output node.

9. The voltage pump as specified in claim 8, further comprising:

a) a first precharge circuit interposed between the gate of said first stage switching device and an input terminal of said first stage switching device, said first precharge circuit precharging the gate and the input terminal of said first stage switching device to the input supply potential; and b) a second precharge circuit interposed between the gate of said second stage switching device and an input terminal of said second stage switching device, said second precharge circuit precharging the gate and the input terminal of said second stage switching device to the input supply potential.

10. The voltage pump as specified in claim 9, wherein said intermediate potential is an actuation potential of said first precharge circuit.

11. The voltage pump as specified in claim 9, wherein said output potential is an actuation potential of said second precharge circuit.

12. The voltage pump as specified in claim 8, further comprising:

a) a first capacitor electrically coupled to an input node of the first stage switching device;

b) a first buffer circuit electrically interposed between the input supply node and the first capacitor, said first buffer circuit driving the supply potential from said input supply node to said first capacitor in order to boost a potential of the input node of the first stage switching device by an amount equal to said input supply potential;

c) a second capacitor electrically coupled to the gate of the first stage switching device; and d) a second buffer circuit electrically interposed between the input supply node and the second capacitor, said second buffer circuit driving the supply potential from said input supply node to said second capacitor in order boost a potential of the gate of the first stage switching device by an amount equal to said input supply potential.

13. The voltage pump as specified in claim 12, wherein said first capacitor has a larger capacitance than said second capacitor.

14. The voltage pump as specified in claim 12, wherein said first and said second capacitors have equal capacitances.

15. The voltage pump as specified in claim 8, further comprising:

a) a third capacitor electrically coupled to an input terminal of the second stage switching device;

b) a third buffer circuit electrically interposed between the input supply node and the third capacitor, said third buffer circuit driving the supply potential from said input supply node to said third capacitor in order to boost a potential of the input terminal of the second stage switching device by an amount equal to said input supply potential;

c) a fourth capacitor electrically coupled to the gate of the second stage switching device; and d) a fourth buffer circuit electrically interposed between the first stage output node and the fourth capacitor, said fourth buffer circuit driving the intermediate potential from said first stage output node to said fourth capacitor in order to boost a potential of the gate of the second stage switching device by an amount equal to said intermediate potential.

16. The voltage pump as specified in claim 15, wherein said third capacitor has a larger capacitance than said fourth capacitor.

17. The voltage pump as specified in claim 15, wherein said third and said fourth capacitors have equal capacitances.

18. The voltage pump as specified in claim 8, wherein said output potential is equal to twice the input supply potential.

* * * * *